(12) United States Patent
Kobayashi

(10) Patent No.: US 7,484,958 B2
(45) Date of Patent: Feb. 3, 2009

(54) VERTICAL BOAT FOR HEAT TREATMENT AND METHOD FOR PRODUCING THE SAME

(75) Inventor: Takeshi Kobayashi, Fukushima (JP)

(73) Assignee: Shin-Etsu Handotai Co., Ltd., Tokyo (JP)

( * ) Notice: Subject to any disclaimer, the term of this patent is extended or adjusted under 35 U.S.C. 154(b) by 56 days.

(21) Appl. No.: 10/563,986

(22) PCT Filed: Jul. 13, 2004

(86) PCT No.: PCT/JP2004/009960

§ 371 (c)(1),
(2), (4) Date: Jan. 10, 2006

(87) PCT Pub. No.: WO2005/008764

PCT Pub. Date: Jan. 27, 2005

(65) Prior Publication Data

US 2006/0199133 A1    Sep. 7, 2006

(30) Foreign Application Priority Data

Jul. 16, 2003  (JP) .............................. 2003-275657
Aug. 25, 2003  (JP) .............................. 2003-300527

(51) Int. Cl.
  *F27B 5/00*  (2006.01)
(52) U.S. Cl. .................... 432/258; 211/41.18
(58) Field of Classification Search ................. 432/253, 432/258; 211/41.18; 148/527
  See application file for complete search history.

(56) References Cited

U.S. PATENT DOCUMENTS 5,482,558 A * 1/1996 Watanabe et al. ........... 118/728
6,287,112 B1 * 9/2001 Van Voorst Vader et al. 432/258
6,488,497 B1 * 12/2002 Buckley et al. ............. 432/258
6,796,439 B2 * 9/2004 Araki ....................... 211/41.18
7,033,168 B1 * 4/2006 Gupta et al. ................ 432/253
7,201,280 B2 * 4/2007 Cho ........................ 211/41.18
2002/0092815 A1 * 7/2002 Kim et al. ................ 211/41.18
2005/0145584 A1 * 7/2005 Buckley et al. .......... 211/41.18

FOREIGN PATENT DOCUMENTS

JP    A-05-129214    5/1993

(Continued)

Primary Examiner—Gregory A Wilson
(74) Attorney, Agent, or Firm—Oliff & Berridge, PLC

(57) ABSTRACT

A vertical boat 10 for heat treatment comprising a top plate 1, a bottom plate 2, and a column member fixed between the top plate and the bottom plate, a plurality of grooves 8 being formed in the column member, and a supporting part for horizontally supporting a wafer-like body to be treated being formed between the grooves, wherein, as the column member, two or more column members 3 and 4, each of which has a circular arc-shaped cross section and has the supporting parts in the shape of circular arc formed integrally inside by formation of the grooves, are cylindrically disposed, and the wafer-like body to be treated is inserted from the grooves of the column members and supported along a circumferential part of a lower surface thereof by the respective circular arc-shaped supporting parts. Thereby, there is provided a vertical boat for heat treatment that can effectively prevent a slip from being generated on a wafer and such during heat treatment, has low material cost, and is relatively easily produced.

8 Claims, 10 Drawing Sheets

FOREIGN PATENT DOCUMENTS

| | | |
|---|---|---|
| JP | A-06-168903 | 6/1994 |
| JP | A-06-260438 | 9/1994 |
| JP | A-09-106956 | 4/1997 |
| JP | A-09-251961 | 9/1997 |
| JP | A-10-022228 | 1/1998 |
| JP | A-2001-176811 | 6/2001 |

* cited by examiner

TRAVELING DIRECTION
OF CIRCUMFERENTIAL BLADE (a)

(b)

TRAVELING DIRECTION
OF CIRCUMFERENTIAL BLADE (a)

(b)

VERTICAL BOAT FOR HEAT TREATMENT AND METHOD FOR PRODUCING THE SAME

TECHNICAL FIELD

The present invention relates to a vertical boat for heat treatment of a semiconductor wafer and such, and particularly relates to a vertical boat for heat treatment that is preferable when a silicon wafer is subjected to heat treatment and a method for producing it.

BACKGROUND ART

In a case that devices are produced by using a wafer cut out from a semiconductor ingot such as a silicon single crystal, there are many steps from processing of a wafer to formation of a device. There is a step of heat treatment as one of these steps. The heat treatment step is a very important process that is performed for the purpose of formation of a defect-free layer in a surface layer of a wafer, gettering, crystallization, formation of oxide film, impurity diffusion, and such.

As a diffusion furnace used in such heat treatment step of a wafer such as oxidization or impurity diffusion (an apparatus for oxidization and diffusion), along with a diameter of a wafer being larger, there has been mainly used a vertical furnace 20 for heat treatment in which the heat treatment is performed with many wafers W being horizontally supported at a predetermined interval as shown in FIG. 8. Wafers W in the heat treatment furnace 20 can be heated with a heater 24 provided around a reaction chamber 22. During heat treatment, a gas is introduced into the reaction chamber 22 through a gas-introducing duct 26, flows from the upper side to the lower side and is discharged outside from a gas-discharging duct 28. The gas to be used is different according to a purpose of heat treatment. However there are mainly used $H_2$, $N_2$, $O_2$, $Ar_2$, and such. In the case of impurity diffusion, these gasses are also used as a carrier gas of an impurity compound gas.

When a wafer W is subjected to heat treatment by using such a vertical furnace 20 for heat treatment, there is used a vertical boat 11 for heat treatment (hereinafter, occasionally referred to as "a boat for heat treatment", "a vertical boat", or simply "a boat") for horizontally setting many wafers W.

FIG. 9(a) shows a scheme of a general boat 11 for heat treatment. A pair of plate materials (a top plate 16a and a bottom plate 16b) is coupled to both ends of four bar-like (cylindrical) supporting columns (rods) 14. Many slits (grooves) 15 are formed in each of the supporting columns 14 and a convex part between the slits 15 acts as a supporting part 12 for the wafer W. In addition, a boat for heat treatment in which many grooves 15 are formed in the cylindrical supporting columns 14 as described above is generally referred to as a short finger type.

When wafers W are subjected to heat treatment by using such a type of a vertical boat 11 for heat treatment, as shown in FIG. 9(b), peripheral parts of a wafer W are supported at four places by the supporting parts 12 formed at the same height in each of the columns 14, and thereby a wafer W is horizontally supported.

In the case of supporting circumferential part of a wafer W as described above, because wafer's own weight concentrates on the supporting parts, stress caused by this constantly acts. And, if the stress is over a critical shearing stress, a dislocation is generated in the wafer. This dislocation spreads to the degree of a macroscopic size thereby to become a slip by the action of the stress. Because generation of a slip significantly degrades quality of the wafer, it is important to prevent this.

However, generally, a slip becomes remarkably easily generated under an atmosphere at a high temperature. Particularly, along with integration of semiconductor devices being higher, a diameter of a wafer has become larger for improving device yield per one wafer. As a result, wafer's own weight becomes larger, and along with this, the stress acting on a wafer tends to increase, and a slip has become more easily generated in the wafer.

Moreover, due to the enlargement of a size of a wafer, particularly while temperature rising, temperature difference between the central part and the circumferential part of a wafer tends to become larger. A thermal stress generated due to this temperature difference is also one of causes of the above-described generation of a slip.

As means for preventing such a slip from being generated during heat treatment, it is suggested to use an auxiliary jig having a shape of a ring or a circular arc (See Japanese Patent Laid-open (Kokai) Publication No. 6-260438). Concretely, through an auxiliary jig having a shape of a ring or a circular arc which is loaded on supporting parts of each of the columns, a circumferential part of a lower surface of a wafer is supported at the entire circumference or a part thereof with a width of several mm to several tens mm. Moreover, there are suggested a method for supporting the entire backside surface of a wafer, and so forth. By using these methods, there can be obtained an effect of suppressing generation of a slip because a surface for supporting a wafer (a supporting surface) becomes larger and thereby load and such are deconcentrated.

However, in recent years, along with integration of semiconductor devices being higher, there has become emphasized a flaw generated on a backside of a wafer as well as a slip. This is because in a case of using a stepper with a pin chuck system, it has been feared that defocus is caused when a backside flaw of a wafer is placed on a pin of the pin chuck. Therefore, there has been noted a boat for heat treatment or an auxiliary jig which is a type of supporting the circumferential part of a wafer rather than a type of supporting the entire surface of backside of a wafer.

In the case of performing heat treatment on a wafer supported along the circumferential part thereof, it is ideal that the wafer is supported along the entire circumference of a lower surface thereof. However, in a general furnace for heat treatment, a wafer is conveyed by using a jig 31 with a type of scooping up a backside of a wafer as shown in FIG. 10(a) or a jig 32 with a type of sucking a backside of a wafer as shown in FIG. 10(b). Therefore, when a wafer is transferred to an auxiliary jig with a ring form and such, in order that these conveying jigs should not interfere with the ring, there is used a circular arc-shaped auxiliary jig 37 which is provided with a cutout at a part of a ring as shown in FIG. 11(a) or a ring-shaped auxiliary jig 38 which is provided with a step 39 as shown in FIG. 11(b).

The circular arc-shaped auxiliary jig 37 as described above has a merit that the number of wafers for batch heat treatment can be increased because the jig is relatively thin and it is needless to spread pitches of grooves of a boat so much. However, it is difficult to maintain a surface accuracy, and if the heights of both ends of the cutout are different, it is feared to generate a slip.

In the case of the auxiliary jig 38 with a step, the jig can be produced with a relatively high surface accuracy and it is advantageous in terms of reduction of a slip. However, the jig 38 is thicker because of the step 39 existing. Therefore, pitches of grooves of a boat come to spread and the number of wafers for batch heat treatment becomes decreased.

Furthermore, because these auxiliary jigs 37 and 38 are produced by hollowing out a circular plate-shaped member, it is troublesome and very expensive. If there is prepared a complete set of several tens of auxiliary jigs and a vertical boat for batch heat treatment, cost becomes very higher, compared to a general vertical boat for directly supporting a wafer as shown in FIG. 9.

On the other hand, there is also suggested a boat for heat treatment, wherein the circular arc-shaped supporting parts are integrally formed in one cylinder to be a main body of the boat (See Japanese Patent Laid-open (Kokai) Publication No. 5-129214). This boat for heat treatment is that after opening parts (cutouts) for passing a conveying jig and for airflow of a surrounding gas are formed in a cylinder made of SiC and such in the vertical direction (axial direction), horizontal grooves for inserting wafers thereinto and supporting a circumferential part of a lower surface thereof are formed up to the inside of the cylinder in the horizontal direction. Such a boat can support a wafer along a circumferential part of a lower surface thereof without using such a circular arc-shaped auxiliary jig as described above.

However, in the boat that vertical and horizontal grooves are formed in one cylinder as described above, there are problems that it is necessary to form at first a plurality of wide cutouts for passing a conveying jig and for airflow of a surrounding gas, and it is troublesome to form these cutouts in a cylinder. Moreover in the case that chipping or crack is generated even at one point, there is a problem that the entire cylinder becomes wasted, like so, production yield is low, and consequently production cost become higher.

Moreover, there is also a problem that if many cutouts are provided, a slip is easily generated in a wafer.

DISCLOSURE OF THE INVENTION

In view of such problems as described above, an object of the present invention is to provide a vertical boat for heat treatment that can effectively prevent a slip from being generated in a wafer and such during heat treatment, has low material cost, and can be relatively easily produced.

In order to accomplish the above object, according to the present invention, there is provided a vertical boat for heat treatment comprising a top plate, a bottom plate, and a column member fixed between the top plate and the bottom plate, a plurality of grooves being formed in the column member, and a supporting part for horizontally supporting a wafer-like body to be treated being formed between the grooves, wherein, as the column member, two or more column members, each of which has a circular arc-shaped cross section and has the supporting parts in the shape of circular arc formed integrally inside by formation of the grooves, are cylindrically disposed, and the wafer-like body to be treated is inserted from the grooves of the column members and supported along a circumferential part of a lower surface thereof by the respective circular arc-shaped supporting parts.

In a vertical boat for heat treatment wherein two or more column members, each of which has the circular arc-shaped supporting parts integrally formed inside by formation of the grooves, are cylindrically disposed as described above, a wafer-like body to be treated can be supported along a circumferential part of a lower surface thereof without using an auxiliary jig in addition. Therefore, if a semiconductor wafer or the like is subjected to heat treatment by using this boat for heat treatment, a slip can be effectively prevented from being generated.

Furthermore, material to be each of the column members can be sufficient at a small amount, compared to a cylindrical boat, and also it is needless to bother to form a cutout for passing a conveying jig through if a predetermined interval between the column members is provided. Therefore, production yield is high, production cost becomes low, and consequently the boat becomes low in cost.

It is possible that as the column member, two column members having the circular arc-shaped supporting parts each having a center angle of from 60° to 170° are oppositely disposed.

If two column members having the supporting parts each having a relatively large center angle are oppositely disposed, there is ensured an opening (cutout) for passing a conveying jig through and for airflow of an atmosphere gas between the column members, it become easy to convey a body to be treated such as a wafer, and also, uniform heat treatment can be performed. Furthermore, for example, because two symmetrical column members can be used, or members having exactly the same form can be oppositely disposed, production cost is suppressed to be lower and the boat becomes lower in cost.

It is possible that as the column member, three or more column members having the circular arc-shaped supporting parts each having a center angle of 20° to 100° are disposed.

If three or more column members having the circular arc-shaped supporting parts each having a relatively small center angle are disposed as described above, for example, a cutout for airflow of an atmosphere gas between the column members can be arbitrarily ensured according to need, and it becomes possible to perform uniform heat treatment. And if the column members have the same form, production cost can be more reduced.

It is also possible that each of the column members is provided with a vent at the same height as each of the grooves.

If a vent, particularly a vent corresponding to each of the grooves, is ensured in the column members themselves in addition to spaces between the respective column members, a surrounding gas becomes to more easily pass inside and outside the boat and the body to be treated can be subjected to heat treatment uniformly. Moreover, although the vent is formed at the same height as each of the grooves, because each supporting part of the column members is not disconnected, a cutout is small and generation of a slip can be more efficiently suppressed.

It is possible that the vertical boat for heat treatment is for heat treatment of a silicon wafer.

A vertical boat is frequently used for heat treatment of silicon wafers, and the boat constituted according to the present invention is particularly effective for preventing generation of a slip. Moreover, because the boat itself is low in cost, it is possible to lead to lowering production cost of a wafer.

It is preferable that an edge of a supporting surface of the supporting part is chamfered.

If the edge of the supporting surface to be in contact with the body to be treated such as a wafer is chamfered as described above, it is possible to more certainly prevent generation of a slip or a flaw.

It is also possible that the supporting surface of the supporting part is downward sloped in the direction of the inside.

If the supporting surface is sloped as described above, a wafer or the like is supported in the vicinity of the circumferential part thereof. And thus, it is possible to more effectively prevent generation of a flaw and such on the backside of the wafer.

Furthermore, according to the present invention, there is provided a method for producing a vertical boat for heat treatment which comprises a top plate, a bottom plate, and a column member fixed between the top plate and the bottom plate, and is for horizontally supporting a wafer-like body to be treated, wherein the method comprises a step of preparing column members each of which has a circular arc-shaped cross section and has a larger outside radius and a smaller inside radius than a radius of the body to be treated, a step of cylindrically disposing two or more said column members between the top plate and the bottom plate to fix the column members, a step of forming grooves in each of the column members and at the same time forming circular arc-shaped supporting parts for supporting in the inside thereof the body to be treated along a circumferential part of its lower surface.

According to the method as described above, there can be effectively produced the vertical boat for heat treatment according to the present invention. And production cost can be suppressed to be low.

More specifically, there is provided a method for producing the vertical boat for heat treatment according to the present invention as described above, wherein, the method comprises a step of cylindrically disposing two or more said column members having a circular arc-shaped cross section between the top plate and the bottom plate to fix the column members, a step of cutting the column members from the direction to insert the body to be treated thereby to form the grooves at the same time and to form the circular arc-shaped supporting parts in the inside thereof, and a step of cutting the column members from a different direction at the same height thereby to pass it through.

According to the method as described above, there can be effectively produced a vertical boat for heat treatment, wherein two column members are oppositely disposed and each of the column members has the circular arc-shaped supporting parts integrally formed. And production cost can be suppressed to be lower.

Moreover, as another method, there is provided a method for producing a vertical boat for heat treatment, wherein the method comprises a step of producing column members each of which has a circular arc-shaped cross section and has a beam outside, a step of cylindrically disposing two or more said column members between the top plate and the bottom plate to fix the column members, and a step of, by using a circumferential blade which has a radius larger than an inside radius of the column members and smaller than an outside radius of a part to be a beam, cutting each of the column members from the direction to insert the body to be treated thereby to form the grooves, at the same time to form the circular arc-shaped supporting parts in the inside thereof, and further to pass through the other parts than the beam.

According to the method as described above, it is possible to form grooves for inserting a wafer thereto, supporting parts for supporting a peripheral part of a wafer, further through-holes for ensuring airflow of a surrounding gas and such, and so forth at one time by a circumferential blade. And production cost can be suppressed to be lower.

The vertical boat for heat treatment according to the present invention is constituted by cylindrically disposing two or more column members each of which has a circular arc-shaped cross section and has the circular arc-shaped supporting parts integrally formed inside. In the case of the boat for heat treatment as described above, it is needless to additionally prepare an auxiliary jig in a shape of a circular arc or a ring and a wafer can be supported in a large area along a wafer circumferential part. Additionally, because there can be relatively easily produced the boat with small amounts of material, the boat becomes low in cost.

Moreover, an interval between the grooves and a thickness of the supporting parts can be the same degrees as a general short finger type of a vertical boat for heat treatment, and the supporting parts can maintain high surface accuracy and high strength. Accordingly, for example, if there is used the boat for heat treatment according to the present invention when a silicon wafer is subjected to heat treatment, annealed wafers almost never having a slip dislocation or a backside flaw can be mass-produced at a low cost and with high productivity.

BEST MODE FOR CARRYING OUT THE INVENTION

Hereinafter, as a preferable embodiment, a vertical boat for heat treatment according to the present invention, which is used in heat treatment of silicon wafers, will be specifically explained on the basis of the appended drawings.

Figure 1:
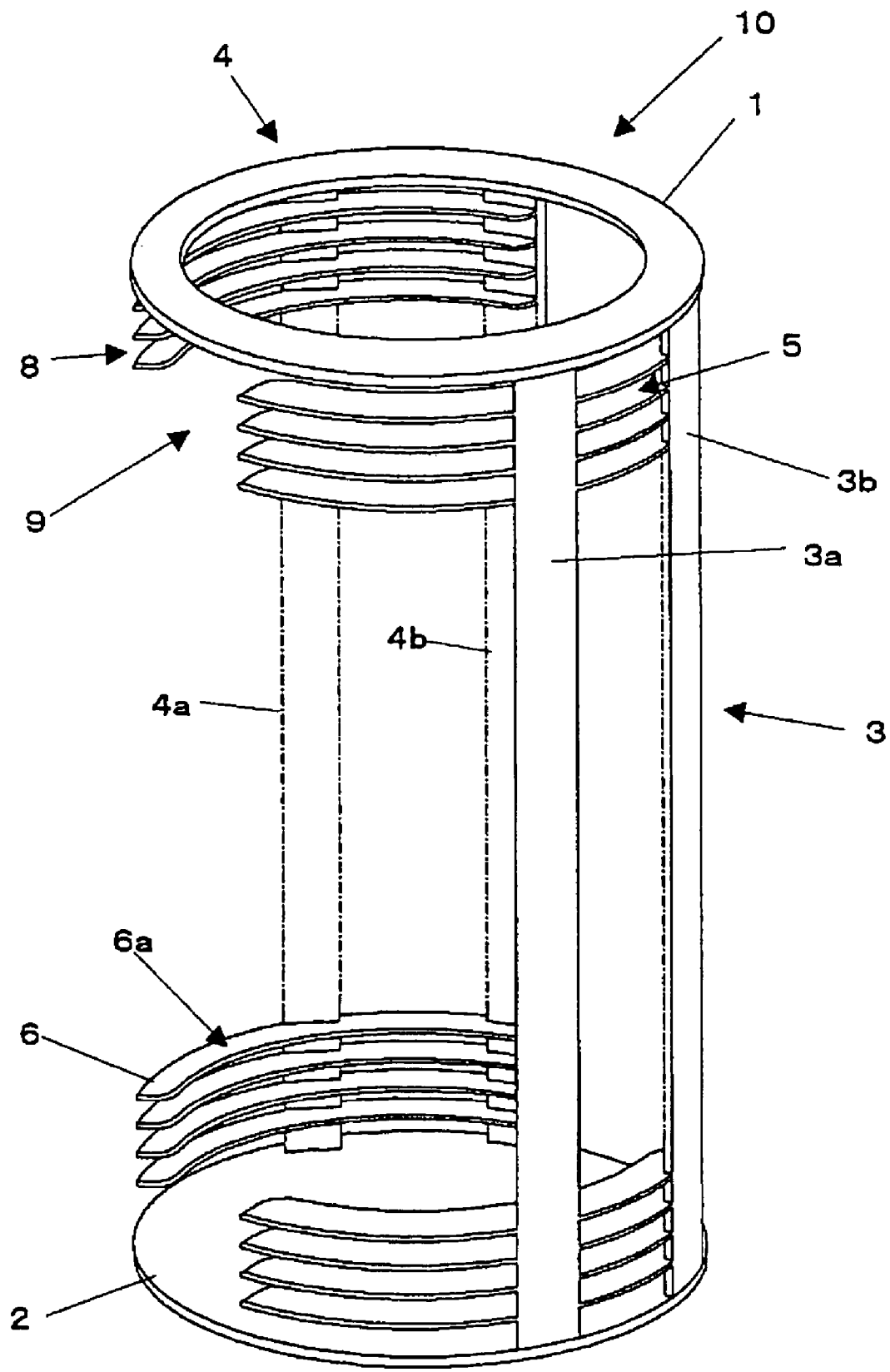
FIG. 1 is a perspective view showing an example of the vertical boat for heat treatment according to the present invention.

FIG. 1 shows a scheme of an example of the vertical boat for heat treatment according to the present invention. This boat for heat treatment 10 is that two column members 3 and 4 each having a circular arc-shaped cross section with a center angle of about 120° (occasionally referred to as circular arc-shaped column member or simply column member) are oppositely disposed so as to make a cylindrical shape and fixed between a hollow discal top plate 1 and a discal bottom plate 2 positioned in parallel so as to face the top plate 1. Size (degree of a center angle) or disposition of each of the circular arc-shaped column members is set in consideration of a width of a space for passing a conveying jig or a space for passing a surrounding gas.

Each of the column members 3 and 4 has circular arc-shaped supporting parts 6 integrally formed inside by formation of a plurality of grooves 8. The respective grooves 8 are formed at a regular interval perpendicularly to each of the column members 3 and 4. Description of the supporting parts 6 in the intermediate portion of the boat 10 is omitted in FIG. 1.

In this boat for heat treatment 10, moderate openings (cutouts) are formed in a vertical direction between the opposite respective column members 3 and 4. The grooves 8 are formed in the side to insert a wafer thereto to be wider than a diameter of a wafer to be subjected to heat treatment so as not to be in contact with the wafer. Thereby, when a wafer is loaded, a conveying jig can pass between two column members without interfering with them.

On the other hand, in the approximately middle of the circular arc of each of the column members 3 and 4 and in the opposite side of the side to insert a wafer thereto, portions to be columns (column parts 3a, 3b, 4a, and 4b) are formed in the vertical direction. And, through-holes 5 are formed between the columns 3a and 3b. The through-holes 5 act as vents, circulation of surrounding gas or transfer of heat is rapidly performed during heat treatment, and it becomes possible to perform uniform treatment of the entire surface of a wafer. Moreover, because each of the through-holes (vents) 5 is formed at the same height as each of the grooves 8 of the respective column members 3 and 4, in each supporting part 6 there is no cutout except between the column members 3 and 4. Accordingly, a wafer is supported along a circumstantial part of a lower surface thereof by two circular arc-shaped supporting parts and generation of a slip can be effectively prevented.

Moreover, it is preferable that an edge of a surface 6a for supporting a wafer in the supporting part 6 is chamfered.

Even if a circumferential part of a lower surface of a wafer is supported by the circular arc-shaped supporting parts 6 of the boat 10 according to the present invention, it is thought that a slip may be generated by reason that a point contact is caused at a small convex remaining on a supporting surface 6a in a case of performing severe heat treatment so that temperature rising rate or a temperature descending rate become very high, or that a point contact is caused particularly at an end or an inside corner of the supporting part 6 when a wafer sags during heat treatment.

Therefore, in order to certainly prevent generation of a slip even in a severe condition of heat treatment, it is preferable that the supporting surface is polished to be smooth, or edge of the supporting surface is chamfered, particularly, and an end 6b or an inside corner 6c of the supporting part 6 is rounded so as not to cause a point contact.

Moreover, the supporting surface 6a of the supporting part 6 may be formed to be downward sloped in the direction of the inside. Even in the case of supporting a wafer along the circumferential part of the lower surface thereof, some backside flaws are generated in a region of a width of several mm from an outer circumference to be in contact with the supporting part 6. However, if the supporting surface 6a is formed not to be a horizontal surface but to have a taper which is downward sloped in the direction of the inside of the boat 10 like an edge of a dish and a wafer is supported in only an edge thereof or near the edge, thereby, backside flaws can be reduced more.

In the case of the boat 10 for heat treatment according to the present invention as described above, because each of the column members 3 and 4 has circular arc-shaped supporting parts 6 integrally formed, a wafer can be widely supported along a circumferential part of a lower surface thereof without using a circular arc-shaped auxiliary jig and such in addition. Moreover, because the respective column members 3a, 3b, 4a, and 4b and the supporting parts 6 are fixed as one, the supporting parts 6 can maintain high surface accuracy and high strength. Moreover, pitches of the grooves can be the same degree as a general short finger type of a boat for heat treatment and the number of wafers for batch heat treatment is not reduced.

Moreover, in addition that an auxiliary jig is needless, because the boat is a combination of circular arc-shaped column members 3 and 4, production cost such as material cost becomes low and the boat becomes low in cost, compared to the case that horizontal and vertical grooves are formed in one cylindrical member.

In addition, with regard to column members 3 and 4 which are oppositely disposed as described above, each of the members may have a smaller or larger center angle, for example, it is preferable that the members have circular arc-shaped supporting parts 6 formed at 60° to 170°. However, when the circular arc-shaped supporting parts are as possible as large, a load of a wafer is dispersed and thereby generation of a slip can be suppressed. Moreover, in the case of using a jig 31 in a type of scooping up, opposite cutouts are needed at two places. However, there is an advantage that transporting of a wafer can be easily performed by oppositely disposing two column members as described above. In addition, it is needless to say that there can be used a conveying jig in a type of suction.

A method for producing the boat 10 for heat treatment as described above is not limited. However, for example, the boat can be relatively easily produced according to the method as follows.

FIGS. 2 to 5 show an example of a method for producing the boat 10 for heat treatment.

Figure 2:
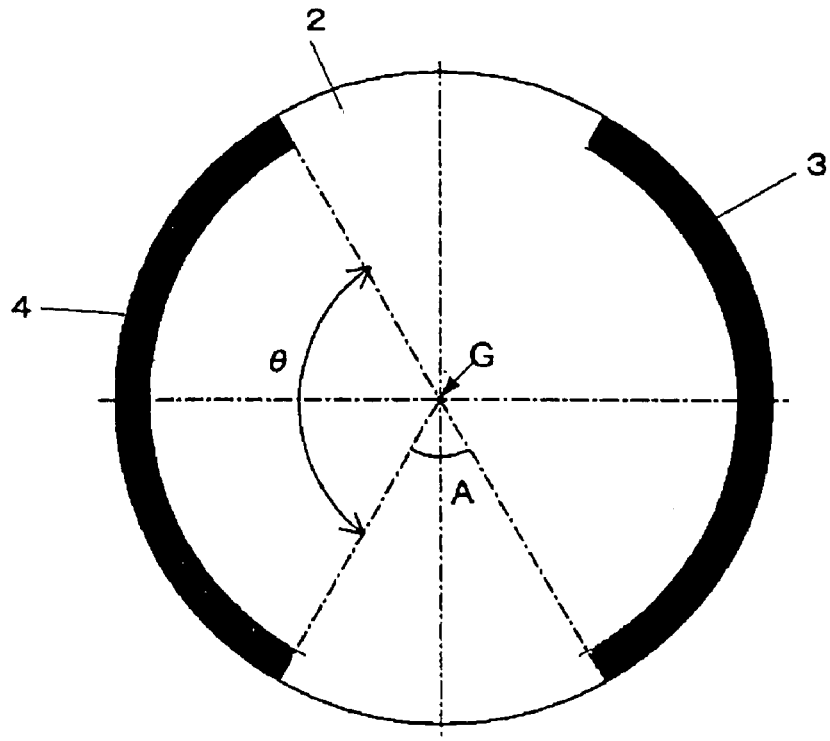
FIG. 2 is a cross sectional view of the boat for heat treatment as shown in FIG. 1 before processing of formation of grooves.
Figure 3:
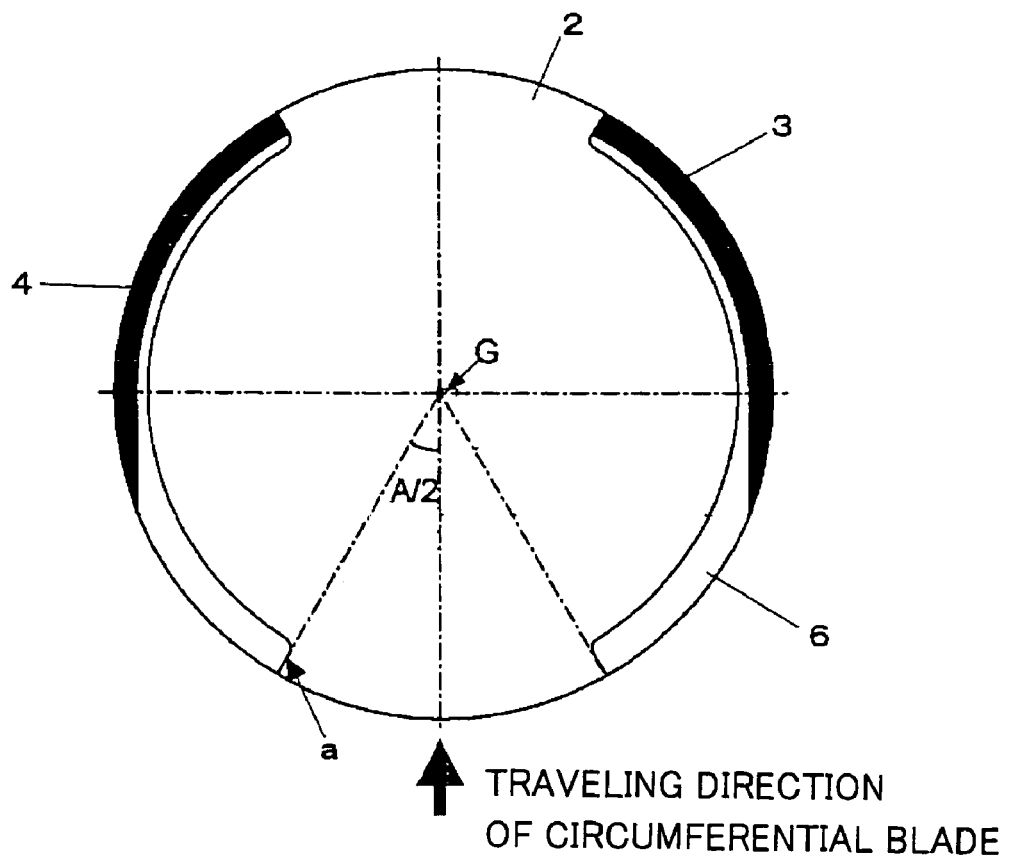
FIG. 3 is a cross sectional view of the boat for heat treatment as shown in FIG. 1 after processing of formation of grooves.

First, as well as a top plate 1 and a bottom plate 2, there are manufactured column members 3 and 4, each of which has a circular arc-shaped cross section as shown in FIG. 2, an outside radius as large as a radius of the top plate 1 or the bottom plate 2 and larger than a radius of a wafer to be subjected to heat treatment, and on the other hand, an inside radius smaller than a radius of the wafer. The center angle $\theta$ of the circular arc may be decided by considering a form of a wafer-conveying jig and such. For example, in the case of conveying a wafer by scooping up a lower surface thereof with a jig, each of the column members 3 and 4 may have a circular arc-shaped cross section with a center angle $\theta$ of about 120°.

Methods for manufacturing the top plate 1, the bottom plate 2, and the circular arc-shaped column members 3 and 4 themselves are not particularly limited. However in the case of a boat 10 for heat treatment of a silicon wafer, by using quartz glass, single crystal silicon, polycrystal silicon and such as a raw material, a wafer can be prevented from contamination. Particularly, a boat based on ceramic material such as silicon carbide (SiC) is preferable because of very excellence in heat resistance as well as the prevention of contamination.

In addition, with regard to column members, if the central angle is about 120° as described above, for example, by vertically dividing each of two shaped cylinder equally among three, there can be obtained three pairs (for three boats for heat treatment) of column members 3 and 4 and thereby material cost can be suppressed to be low.

Next, two manufactured circular arc-shaped column members 3 and 4 are oppositely disposed between the top plate 1 and the bottom plate 2 so that the circular arcs of the cross sections face to each other to make a cylindrical hollow as shown in FIG. 2. And each of the members is fixed to the top plate 1 and the bottom plate 2. Fixing means is not particularly limited, for example, any method such as adhesion by a binder, set-in, or screw-cramp is possible.

After the circular arc-shaped column members 3 and 4 are fixed between the top plate 1 and the bottom plate 2, in the column members 3 and 4, grooves 8 are formed by cutting from the direction to insert a wafer thereto, and at the same time supporting parts 6 are formed in the inside thereof. For the processing of such grooves, it is preferable to use a grooving processing machine loaded with a discal circumferential blade (a diamond cutter) 30 which has a radius smaller than an outside radius of the column members 3 and 4 and larger than a radius of a wafer to be subjected to heat treatment. When grooves 8 are formed, cutting is performed toward a central axis G of the boat 10 from a cutout between two column members and grooves 8 cut to the extent that the central axis of the boat 10 and that of the circumferential blade 30 accord. Thereby, as shown in a cross sectional view of FIG. 3 and a perspective view of FIG. 4, grooves 8 are formed in the respective column members 3 and 4, grooves 8 of which the horizontal width is larger than a diameter of a wafer are formed in the side where the circumferential blade 30 was inserted. At the same time, circular arc-shaped supporting parts 6 in which an inside diameter is smaller and an outside diameter is larger than a diameter of a wafer are formed in the inside of each of the column members 3 and 4.

Figure 5:
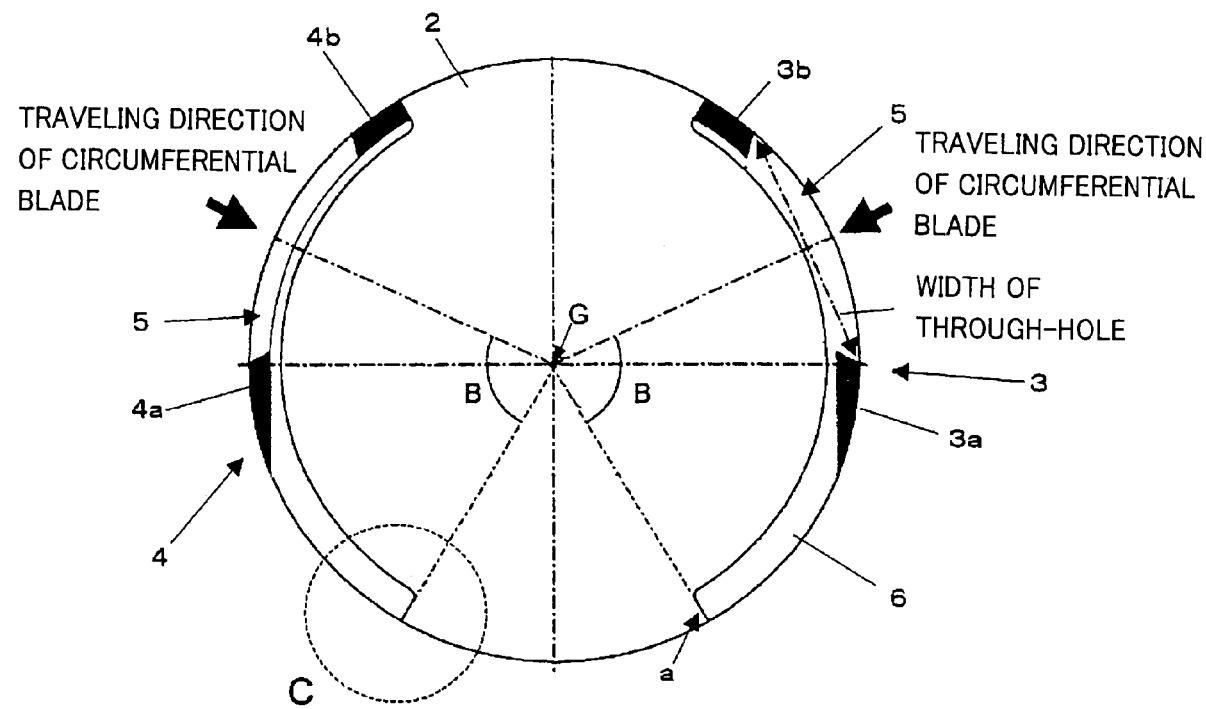
FIG. 5 is a cross sectional view of the boat for heat treatment as shown in FIG. 1 after formation of through-holes.

After grooves 8 are formed in the respective column members 3 and 4 at a predetermined height as described above, the members are passed through by cutting from another direction at the same height. For example, as shown in FIG. 5, through-holes 5 are formed by cutting from an outer circumstance of each of the column members 3 and 4 with a circumferential blade having a smallish radius, so that each of parts to be a column (column parts) 3a, 3b, 4a and 4b is left. If through-holes 5 are formed at the same height as the respective grooves as above, they act as vents which induce circulation of a surrounding gas during heat treatment as mentioned above and transfer of heat is also induced. Therefore, a wafer can be subjected to uniform heat treatment. Moreover, if the through-holes 5 are formed individually as described above, a vent 5 can be formed at the same height as each of the grooves 8 without being disconnected with each of the supporting parts 6.

The form of the through-holes (vents) as described above are not particularly limited, and may be a circular form or a rectangular form at the same height as each of the grooves 8. However, by performing grooving to pass through from also another direction at the same height position as each of the grooves 8 formed from the direction to insert a wafer thereto as described above, there can be easily formed wide through-holes 5.

In addition, a means for forming grooves 8 or through-holes 5 as described above is not limited to the grooving processing machine using the circumferential blade 30 of a diamond cutter. Means such as a laser processing machine, a high-pressure jet flow, and a lathe, may be used as long as processing can be performed in the same way and with similar accuracy.

Figure 6:
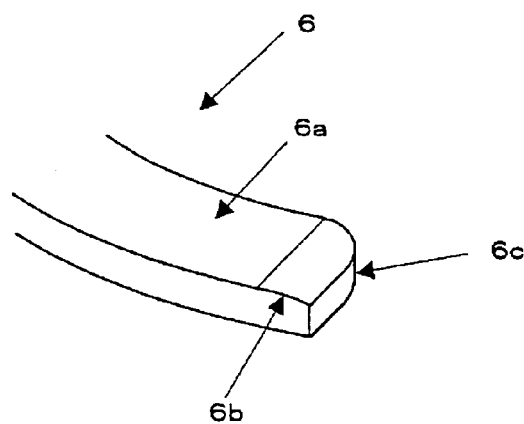
FIG. 6 is a perspective view enlarging an end of a supporting part surrounded by C in FIG. 5.

Moreover, for effectively suppressing generation of a slip from an end of the supporting part 6, it is effective that an end 6b, an inside corner 6c, and the like in a supporting surface side of the supporting part 6 are subjected to chamfering processing to be rounded as shown in FIG. 6 so that a point contact is not caused when a wafer sags during heat treatment. By performing a chamfering processing as described above, generation of a slip can be more effectively prevented.

Figure 7:
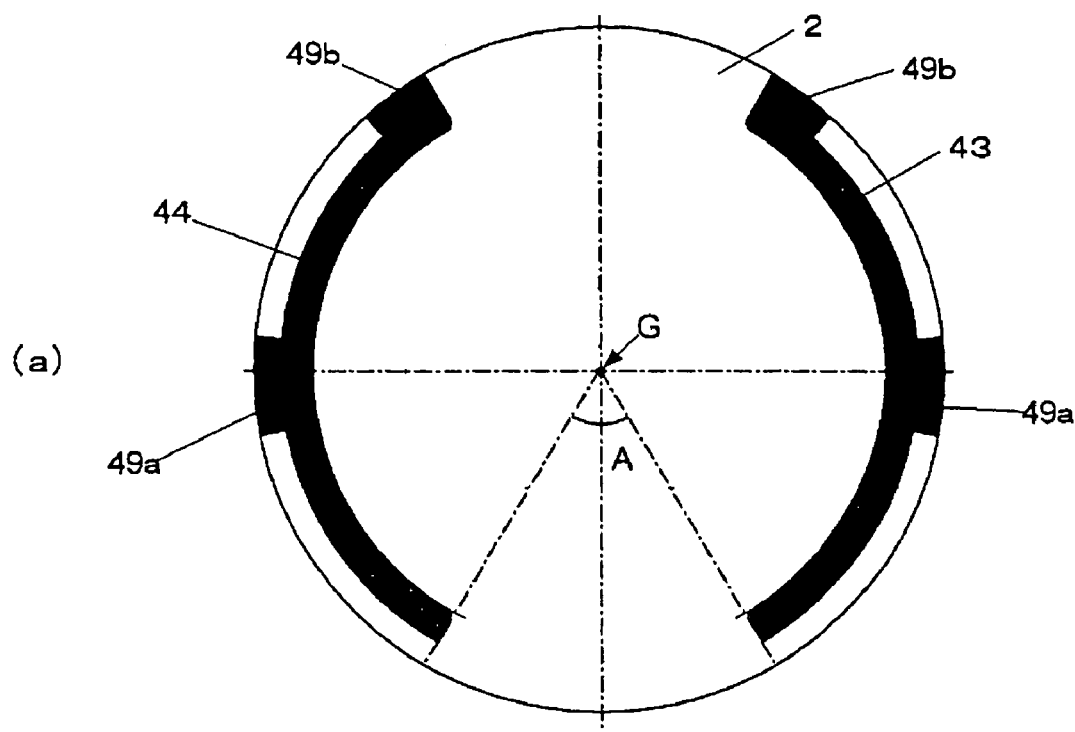
FIG. 7 is a cross sectional view showing another example of the vertical boat for heat treatment according to the present invention. (a) before processing of formation of grooves (b) after processing of formation of grooves
Figure 7:
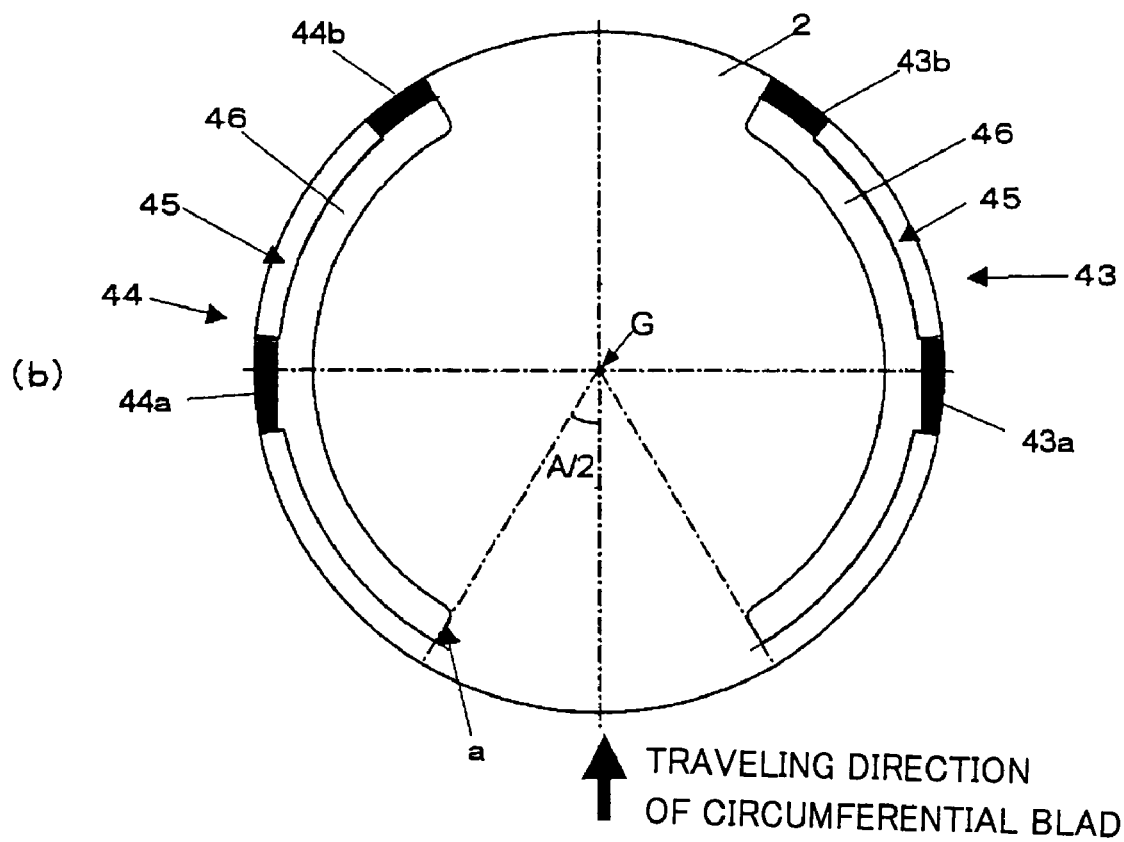

Furthermore, FIGS. 7(*a*) and (*b*) are views showing other methods for producing a boat for heat treatment according to the present invention.

First, there are manufactured column members 43 and 44 wherein each of the members has a circular arc-shaped cross section and beams are formed in the outside (the outer surface) thereof. Each of the column members 43 and 44 has two beams 49a and 49b formed in a longitudinal direction of the members at the approximately middle and one end of the circular arc thereof. The outside radius of a ledge to be the beam 49a or 49b is made to be the approximately same as a radius of the plate 1 or the bottom plate 2, and the outside radius of the other parts than the beam is made to be smaller than a radius of the top plate 1 and such and larger than a radius of a wafer.

The column members 43 and 44 each having the form as described above are oppositely disposed and cylindrically fixed between the top plate 1 and the bottom plate 2. Next, by using a circumferential blade that has a radius being larger than an inside radius of the column member and smaller than an outside radius of a part to be the beam 49a or 49b, grooves are formed by cutting each of the column members 43 and 44 from the direction to insert a wafer thereto as shown in FIG. 7(*b*). Particularly, it is preferable that a size of the circumferential blade is set to be the same as or a little larger than an outside radius excepting beams 49a and 49b of the column members 43 and 44 (to be the size in which cutting can be performed up to the boundary portion with the beams 49a and 49b). In this way, the circular arc-shaped supporting parts are formed in the inside of each of the column members 43 and 44 described above and the other portions than the beams are passed through.

By performing one-time grooving processing as described above, circular arc-shaped supporting parts 46 integrated with column parts 43a, 43b, 44a, and 44b and through-holes 45 are can be formed from one raw material at the same time. Namely, portions of the beams 49a and 49b which are not cut down serve as columns supporting the entire boat. Inside portions that are left after grooves are formed in the supporting members 43 and 44 become circular arc-shaped wafer-supporting parts 46 with particularly wide supporting regions. Moreover, through-holes 45 formed between the respective column parts 43a, 43b, 44a, and 44b act as vents.

And also in this case, the through-holes (vents) 45 are formed at the same height as each of the grooves, and the supporting parts 46 of the column members 43 and 44 are not disconnected. Therefore, a wafer can be supported along a circumferential part of a lower surface thereof by two circular arc-shaped supporting parts.

Hereinabove, examples of boat for heat treatment according to the present invention and method for producing it are explained. However, the present invention is not limited to these configurations.

For example, by using three or more column members each having a center angle of 20° to 100°, they may be cylindrically disposed between the top plate 1 and the bottom plate 2, and circular arc-shaped supporting parts may be formed in the inside of each of the column members in a similar method to above. If three or more circular arc-shaped column members each of which has a relatively small center angle as described above are disposed at predetermined intervals, air permeability is improved because cutouts between the column members are increased, and also it is an advantage that there are easily manufactured column members each of which has a relatively small center angle.

Hereinafter, there will be described examples according to the present invention and comparative examples.

EXAMPLE 1

Production of the Vertical Boat for Heat Treatment

As members to be columns, there were manufactured two silicon carbide (SiC) members each of which had a cross sectional form of a circular arc with an outside radius of 165 mm, an inside radius of 147 mm, and a center angle of 120° and a length of 930 mm. And, the inside corners (corresponding to 6c in FIG. 6) of end faces in the longitudinal direction were chamfered to be R25.

As a member to be a top plate, a hollow disk with an outer diameter of 330 mm, an inner diameter of 270 mm, and a thickness of 4 mm was manufactured, and as a member to be a bottom plate, a disk with a diameter of 330 mm and a thickness of 5 mm was manufactured from SiC, respectively.

Two circular arc-shaped column members as described above were fixed between the top plate and the bottom plate by adhesion with a carbonaceous binder. At this time, the members were disposed so that an outer circumference of each of the column members accorded with an outer circumference of the top plate/the bottom plate as shown in FIG. 2 and the angle A made by one facing end of each of the column members and a central axis G of the boat was 60°.

Next, in order that SiC grain boundary constituting each of the integrated members was impregnated with Si, the members were immersed in melted Si.

For formation of the grooves, there was used a grooving processing machine loaded with a circumferential blade of a diamond cutter with a diameter of 303 mm.

Figure 4:
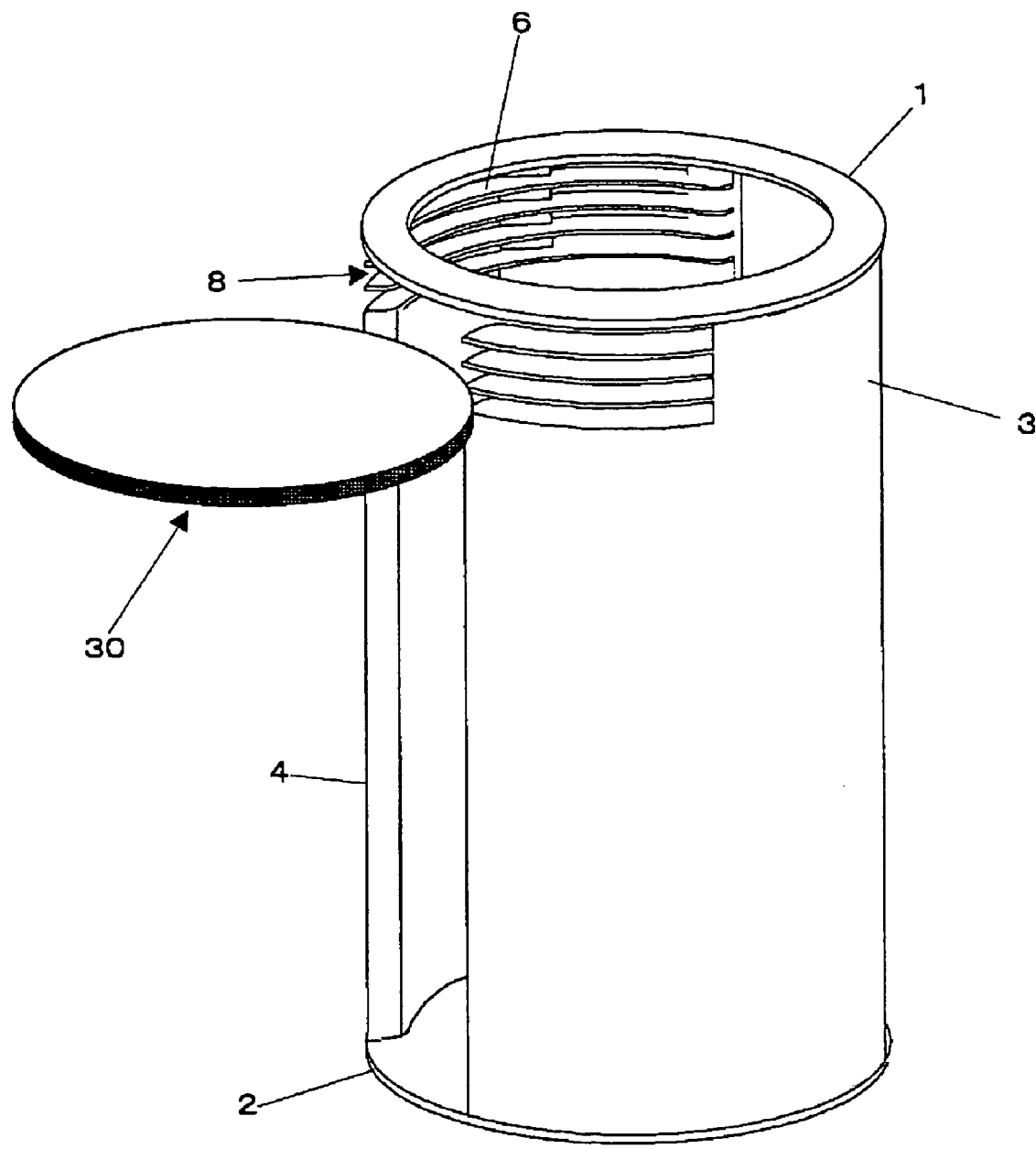
FIG. 4 is a perspective view illustrating processing of formation of grooves of a boat for heat treatment.

First, the above-described integrated column members were set to the grooving processing machine so that an angle A/2 made by the traveling direction of the circumferential blade, the central axis G of the boat, and one end a of the column member was 30°. And the circumferential blade was inserted to the degree that the center of the circumferential blade accorded with the central axis G of the boat by setting a width of the groove in the vertical direction to be 6.6 mm, a thickness of the supporting part formed between the grooves to be 3.0 mm, the number of the grooves to be 95. Thereby, the grooves were formed in each of the column members and at the same time circular arc-shaped supporting members were formed inside. In this way, the grooves were sequentially formed as shown in FIG. 4.

Successively, as shown in FIG. 5, the above-described integrated members were fixed to the grooving processing machine so that an angle B made by the traveling direction of the circumferential blade, the central axis G of the boat, and one end a of the column member is 85°. In addition, here, a circumferential blade with a diameter of 200 mm was used and each of the column members was passed through by cutting at the same height as the groove formed before. As described above, there were formed 95 through-holes (vents) each having a horizontal width of 70 mm in each of the two column members.

After the grooves were formed as described above, edges of a supporting surface of each of the supporting parts were subjected to chamfering processing, particularly corners (6b in FIG. 6) of a supporting surface and an end face intersecting in the supporting member were subjected to chamfering of R 15.

After the product made to be a boat form by a series of the processing as described above were subjected to acid cleaning, a SiC-CVD coating film with about 100 μm was formed. The SiC-CVD coating film had Ra of about 1 μm and it was feared that a slip was generated by a point contact caused at a small convex surface. Therefore, the supporting surfaces were smoothed by polishing to the degree that Ra became about 0.03 μm.

EXAMPLE 2

Production of the Vertical Boat for Heat Treatment

As column members, there were manufactured two silicon carbide (SiC) members each of which had a cross sectional form with an outside radius of 154 mm, an inside radius of 147 mm, and a center angle of 120° and a length of 930 mm. In addition, in the outside (outer circumferential surface) of each of the members, convex parts to be beams with an outside radius of 165 mm were formed in the longitudinal direction at two places (one end and approximately middle of the circular arc) as shown in FIG. 7 (a) and the beam located on the one end of the outer circumferential surface had a center angle of 15°, and the beam near the middle thereof had a center angle of 20°, respectively.

Two column members manufactured as described above were oppositely disposed between a top plate, which was a hollow disk made of SiC with an outer diameter of 330 mm, an inner diameter of 270 mm, and a thickness of 4 mm, and a bottom plate, which was a disk made of SiC with a diameter of 330 mm and a thickness of 5 mm, and the members were fixed by using a binder. At this time, as shown in FIG. 7(a), the members were positioned so that an outer circumference of the beam part of each of the column members accorded with an outer circumference of the top plate/the bottom plate and the angle A made by joining one facing end of each of the column members and a central axis G of the boat was 60°. Next, the integrated members were immersed in melted Si, and thereby SiC grain boundary were impregnated with Si.

For formation of the grooves, there was used a grooving processing machine loaded with a circumferential blade of a diamond cutter with a diameter of 310 mm. The members integrated as described above were set to the grooving processing machine so that an angle A/2 made by the traveling direction of the circumferential blade, the central axis G of the boat, and one end a of the column member is 30°. A width of the groove in the vertical direction was set to be 6.6 mm, a thickness of the supporting part formed between the grooves to be 3.0 mm, and the number of the grooves to be 95. And, the circumferential blade was inserted to the degree that the center of the circumferential blade accorded with the central axis G of the boat, and thereby the grooves were formed in each of the column members, at the same time the wafer supporting parts were formed inside, and further, through-holes (vents) were formed between the beams of each of the members.

Moreover, corners of supporting surfaces and end faces intersecting in the supporting parts were subjected to chamfering of R 15.

After the product made to be a boat form by a series of the processing as described above were subjected to acid cleaning, a SiC-CVD coating film with about 100 μm was formed. the supporting surfaces were smoothed by polishing to the degree that Ra became about 0.03 μm.

(Experiment)

Heat Treatment of a Silicon Wafer

As a silicon wafer to be subjected to heat treatment, there was prepared mirror polished silicon wafers each having a diameter of 300 mm and a thickness of 779 μm.

For a boat for heat treatment, there was used the vertical boat 10 for heat treatment produced in Example 1, that had circular arc-shaped supporting parts as shown in FIG. 1.

Figure 8:
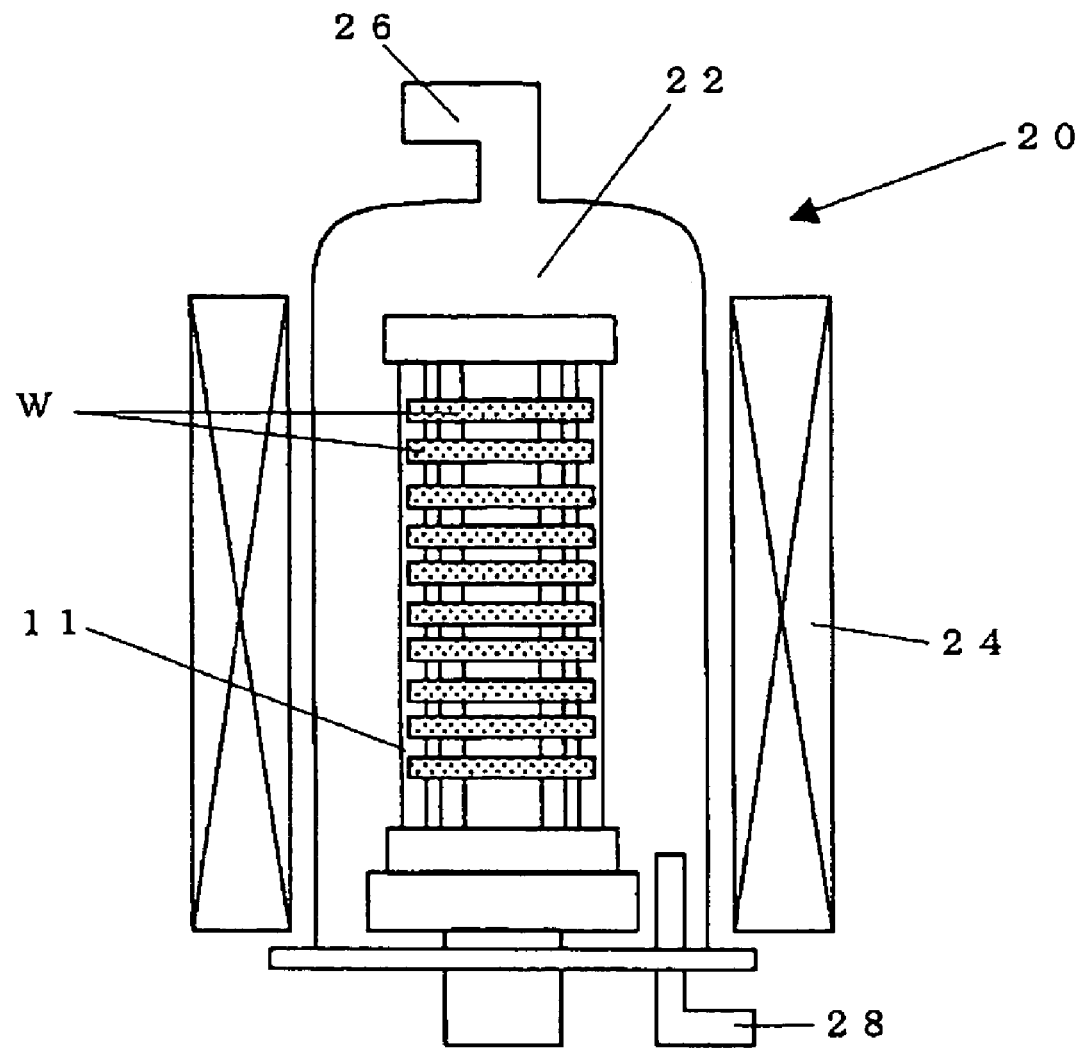
FIG. 8 is a schematic view showing an example of a vertical furnace for heat treatment.

95 wafers were placed in this boat so that a circumferential part of a lower surface of each wafer was uniformly in contact with the circular arc-shaped supporting surface. The boat was carried into the furnace for heat treatment as shown in FIG. 8. And heat treatment was performed for one hour at 1200° C. in an argon atmosphere in the furnace.

After the heat treatment, the boat was carried out of the furnace for heat treatment. And with respect to 75 wafers excepting 10 wafers from the top and 10 wafers from the bottom, generation status of a slip dislocation was confirmed by visual observation and X-ray Lang method.

As a result, there was no slip dislocation in either case of the visual observation or the X-ray Lang method.

(Comparative Experiment 1)

Figure 9:
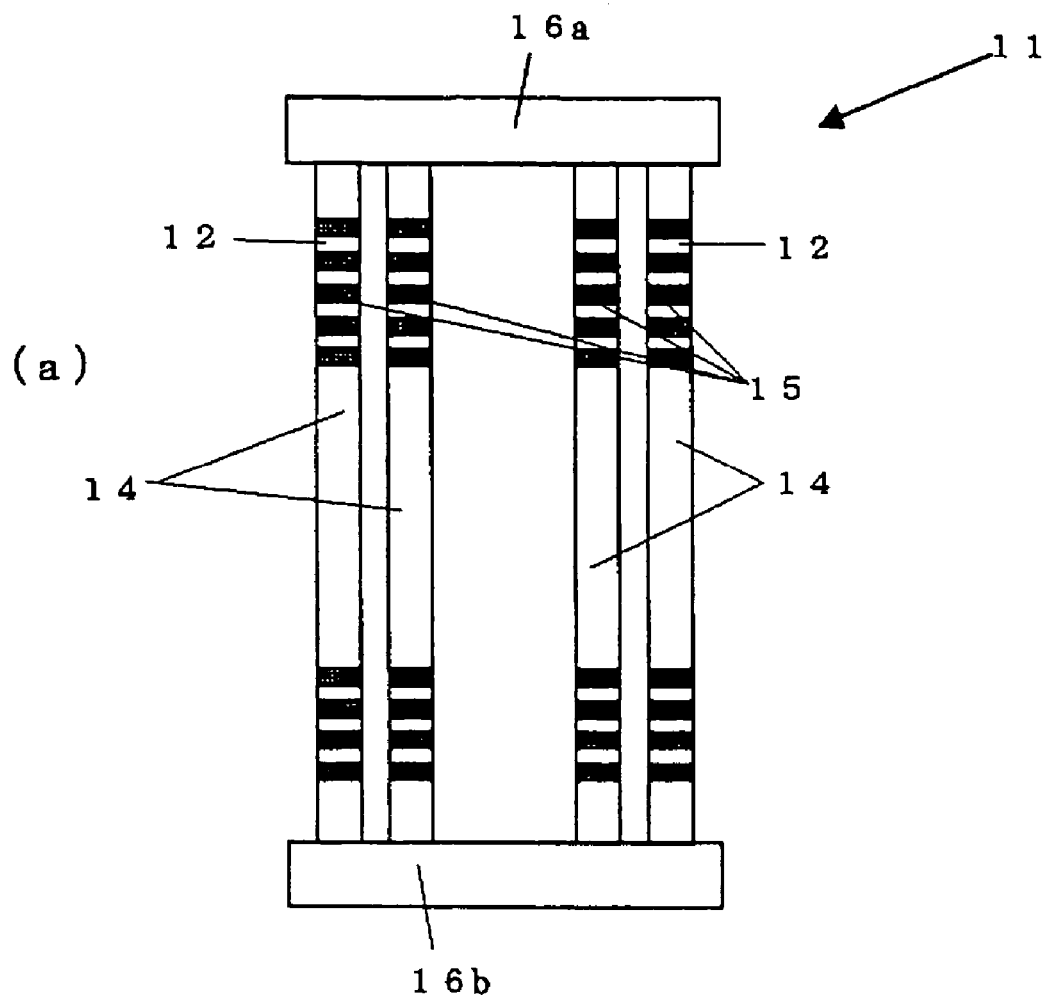
FIG. 9 is a schematic view showing an example of a conventional vertical boat for heat treatment. (a) a front view (b) a cross sectional view in the horizontal direction (a state of supporting a wafer)
Figure 9:
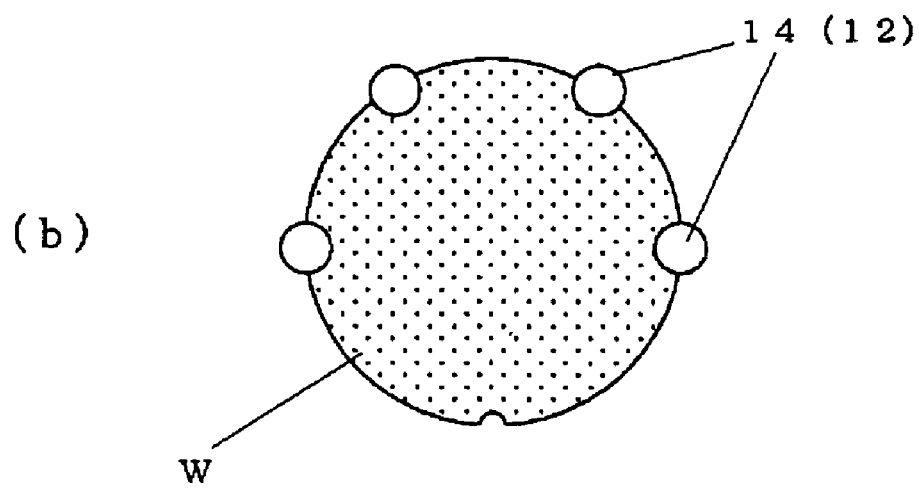
Figure 10:
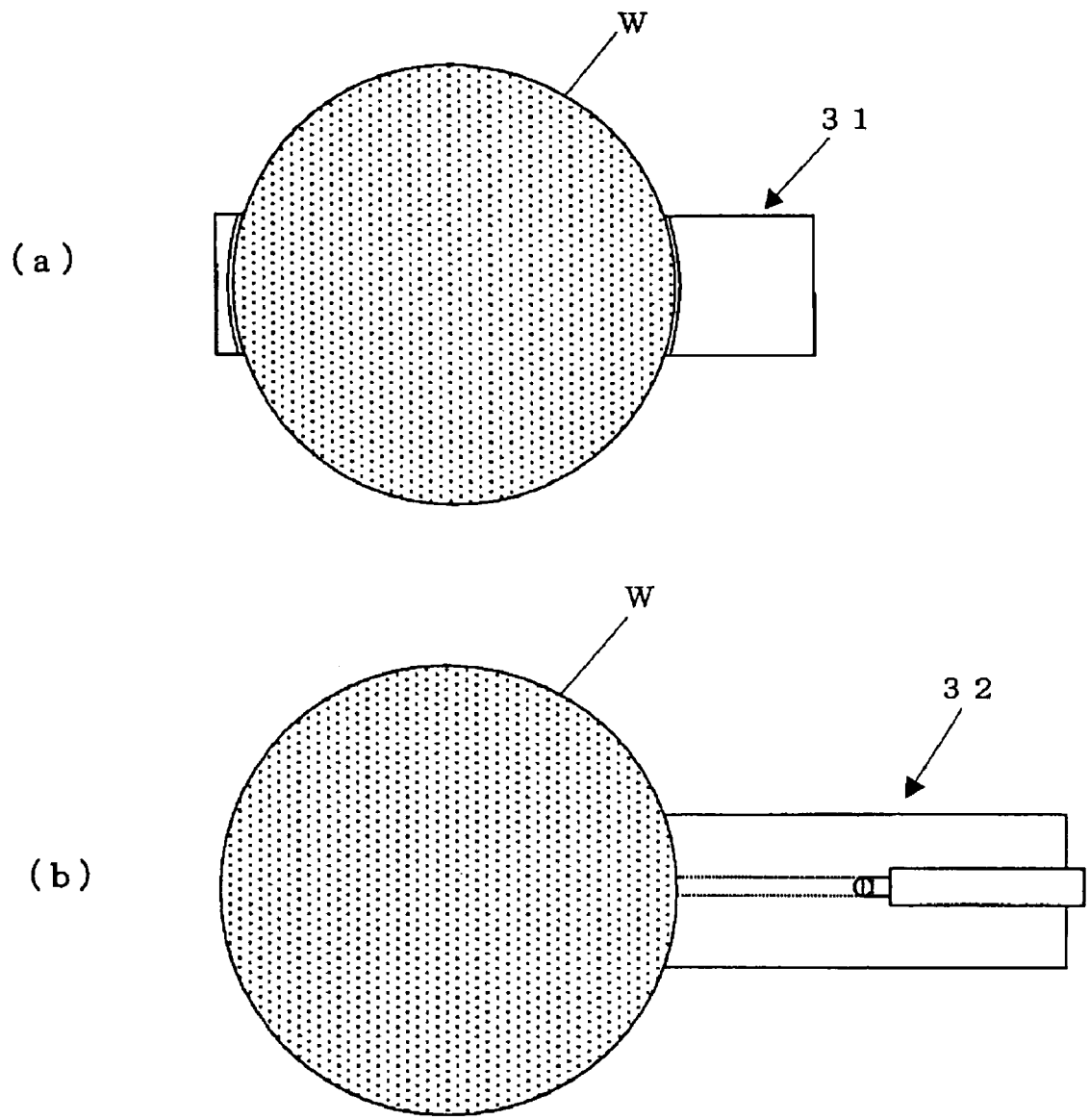
FIG. 10 is a schematic view showing examples of conveying jigs. (a) a type of scooping up (b) a type of suction
Figure 11:
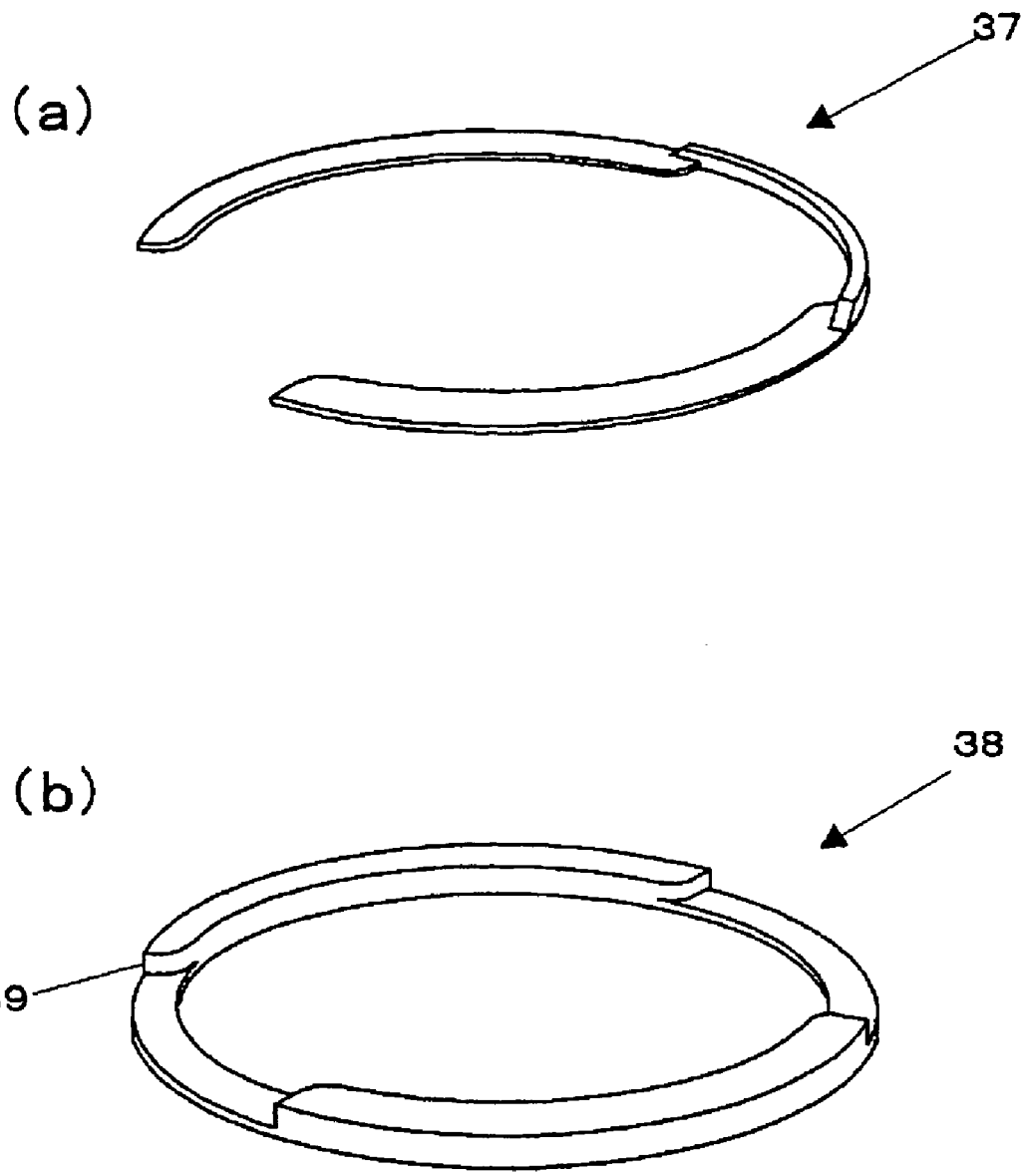
FIG. 11 is a perspective view showing examples of auxiliary jigs for supporting a peripheral part of a wafer. (a) a circular arc-shaped auxiliary jig (b) a ring-shaped auxiliary jig with a step

By using the general vertical boat for heat treatment (a short finger type) as shown in FIG. 9, heat treatment of a silicon wafer was performed in the same manner as the above-described experiment.

After the heat treatment, generation status of a slip dislocation was observed by visual observation and X-ray Lang method. There existed many wafers that generation of a slip dislocation could be also clearly recognized even by the visual observation. A generation rate of a slip dislocation evaluated by X-ray Lang method was 90% or more, thus a slip dislocation was observed on most of wafers.

(Comparative Experiment 2)

Figure 12:
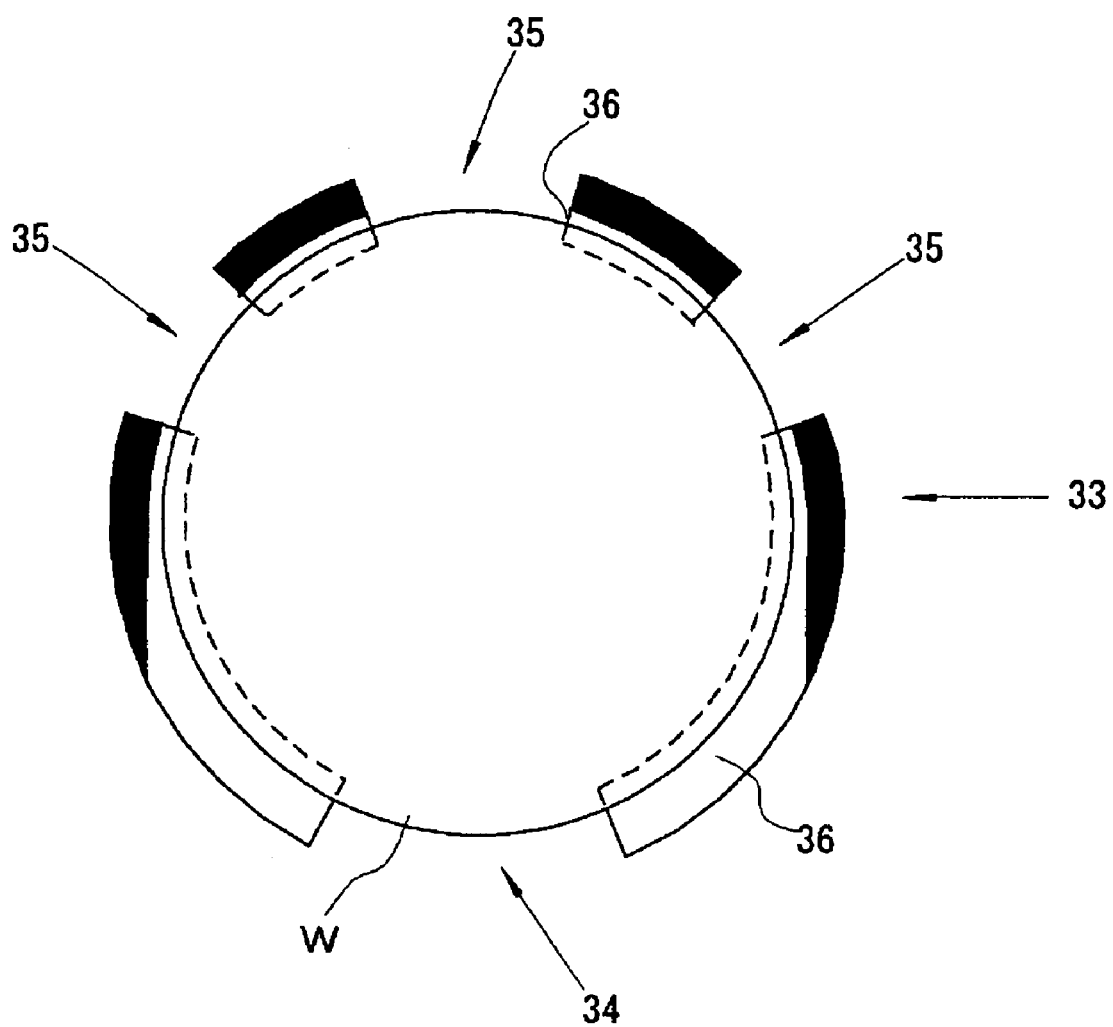
FIG. 12 is a schematic cross sectional view of an integrated type of vertical boat for heat treatment that was used in Comparative experiment 2.

As shown in a schematic cross sectional view in FIG. 12, there was used an integrated type of a vertical boat 33 provided with openings (cutouts) 34 and 35 having a constant width along the longitudinal direction, for passing a conveying jig and for airflow of a surrounding gas, in the vertical direction by forming vertical grooves 34 and 35 respectively in the vertical direction (the axial direction) of one cylinder to be a main body of the boat.

After the heat treatment, generation status of a slip dislocation was observed by visual observation and X-ray Lang method. There existed some wafers that generation of a slip dislocation could be clearly recognized even by the visual observation. Moreover, in the case of the evaluation by X-ray Lang method, a generation rate of a slip dislocation was about 30%. The generation rate of a slip dislocation was lower, compared to the case of Comparative experiment 1. However, it is thought that because at plural places on the wafer-supporting parts 36 there are parts disconnected by the vertical grooves 35 for airflow of a gas formed along the longitudinal direction as well as a vertical groove 34 for passing a conveying jig, generation of a slip was induced.

The present invention is not limited to the embodiments described above. The above-described embodiments are merely examples, and those having the substantially same constitution as that described in the appended claims and providing the similar working effects are included in the scope of the present invention.

For example, the number of the circular arc-shaped column members and a size of the center angle thereof are not limited to the ones as described above, and may be appropriately decided by considering a form of a wafer-conveying jig and such. Moreover, the circular arc-shaped column members may be a combination of members having different center angles, and the intervals of the column members may be different to each other.

The invention claimed is:

1. A vertical boat for heat treatment comprising:
   a top plate;
   a bottom plate; and
   three or more column members fixed between the top plate and the bottom plate, a plurality of grooves being formed in each column member so as to create a supporting part for horizontally supporting a wafer-like body to be treated between the grooves,
   wherein each column member of the three or more column members has a circular arc-shaped cross section and is cylindrically disposed,
   wherein each column member of the three or more column members has a plurality of individual supporting parts in the vertical direction,
   wherein the supporting parts of the three or more columns are arranged to form sets of supporting parts having a common vertical height, the supporting parts of the sets not being connected to each other but forming a common horizontal plane,
   wherein the supporting parts all have the shape of circular arc having a center angle of 20° to 100°,
   wherein the supporting parts and the column member are a monolithic piece of a same material, and
   wherein the wafer-like body to be treated is inserted from the grooves of the column members and supported along a circumferential part of a lower surface thereof by the three or more respective circular arc-shaped supporting parts in the common horizontal plane.

2. The vertical boat for heat treatment according to claim 1, wherein the column members are provided with a vent at the same height as each of the grooves.

3. The vertical boat for heat treatment according to claim 2, wherein the vertical boat for heat treatment is for heat treatment of a silicon wafer.

4. The vertical boat for heat treatment according to claim 2, wherein an edge of a supporting surface of the supporting part is chamfered.

5. The vertical boat for heat treatment according to claim 2, wherein the supporting surface of the supporting part is downward sloped in the direction of the inside.

6. A method for producing a vertical boat for heat treatment of a horizontally supported wafer-like body to be treated which comprises a top plate, a bottom plate, and a column member fixed between the top plate and the bottom plate, the method comprising:
   manufacturing column members, each of which has a circular arc-shaped cross section having a center angle of 20° to 100° and has a larger outside radius and a smaller inside radius than a radius of the body to be treated;
   cylindrically disposing three or more said column members between the top plate and the bottom plate to fix the column members; and
   forming grooves in each of the column members so as to create circular arc-shaped supporting parts each of which has a center angle of 20° to 100°, for supporting in the inside thereof the wafer-like body to be treated along a circumferential part of its lower surface, and the supporting parts and the column member being formed as a monolithic piece of a same material.

7. A method for producing a vertical boat for heat treatment, the method comprising:
   cylindrically disposing two or more column members having a circular arc-shaped cross section between a top plate and a bottom plate to fix the column members;
   cutting the column members from a direction to insert the body to be treated thereby to form grooves and at the same time to form circular arc-shaped supporting parts in the inside thereof and cutting the column members from a second direction different from the direction, the column members being cut at the same height thereby to form throughholes within each column member.

8. A method for producing a vertical boat for heat treatment, the method comprising:
preparing column members each of which has a circular arc-shaped cross section and has a beam outside;
cylindrically disposing two or more said column members between a top plate and a bottom plate to fix the column members; and
cutting each of the column members with a cutting unit from a direction to insert a body to be treated thereby to form grooves, at the same time to form the circular arc-shaped supporting parts in the inside thereof, and further to pass through the other parts than the beam, the cutting unit having a circumferential blade which has a radius larger than an inside radius of the column members and smaller than an outside radius of a part to be said beam.

* * * * *